US005481695A

United States Patent [19]
Purks

[11] Patent Number: 5,481,695
[45] Date of Patent: Jan. 2, 1996

[54] SYSTEM AND METHOD FOR ESTIMATING CROSSTALK BETWEEN SIGNAL LINES IN A CIRCUIT

[75] Inventor: Stephen R. Purks, Bedford, Mass.

[73] Assignee: Cadence Design Systems, Inc., San Jose, Calif.

[21] Appl. No.: 142,782

[22] Filed: Oct. 26, 1993

[51] Int. Cl.⁶ ...................................................... G06F 17/50
[52] U.S. Cl. .................................. 395/500; 364/DIG. 1; 364/DIG. 2; 364/221.2; 364/221; 364/916; 364/916.3; 364/917.96
[58] Field of Search ..................... 364/DIG. 1 MS File, 364/DIG. 2 MS File, 530, 551.01, 554, 578, 579, 580; 395/100, 118, 133, 155, 157, 500, 575

[56] References Cited

PUBLICATIONS

Chi–Lai Huang, Marek Ryniejski, "Path–Distribution Analysis Simplifies Logic–Circuit Timing".
S. Purks, "Crosstalk Timing Windows (6.0)" Aug. 20, 1991, Valid Logic Systems, pp. 1–27.

*Primary Examiner*—Robert B. Harrell
*Attorney, Agent, or Firm*—Townsend and Townsend and Crew

[57] ABSTRACT

A crosstalk analysis system that uses automatically extracted circuit timing information to calculate real-world crosstalk estimates. The crosstalk analysis system of the present invention improves the accuracy of crosstalk calculations by incorporating into the analysis automatically extracted intersignal timing information. The present invention monitors a functional simulation run to automatically provide summary net activity time windows that are directly forward-annotated into a crosstalk analyzer. The crosstalk analyzer drastically reduces the number of crosstalk false alarms by avoiding summation of crosstalk noise between neighbor nets that switch out of phase with respect to each other.

11 Claims, 5 Drawing Sheets

SYSTEM AND METHOD FOR ESTIMATING CROSSTALK BETWEEN SIGNAL LINES IN A CIRCUIT

BACKGROUND OF THE INVENTION

The present invention relates in general to computer aided circuit design tools, and in particular to a circuit simulator capable of performing real-world estimation of signal crosstalk based on forward-annotated inter-signal timing information.

In electronic circuits, crosstalk noise is generated when signal activity on one signal conductor network ("signal net") couples as noise to neighboring signal nets through parasitic capacitances and/or mutual inductances. The amount of crosstalk is essentially a function of circuit layout geometry (proximity of signal nets with respect to each other), circuit characteristics (signal speed and strength), and inter-signal timing (relative timing of signal switching between neighboring nets). To minimize the undesirable effects of crosstalk noise on circuit performance, crosstalk analysis tools have been developed to predict the magnitude of crosstalk. This information is used by the designer to modify the circuit layout and to improve performance by minimizing crosstalk noise.

Existing crosstalk analysis tools comprehend the physical layout geometry of the circuit interconnections to extract trace parasitics. These tools also account for circuit characteristics such as edge speeds for the drivers of the offending neighbor nets. For inter-signal timing information, however, these tools typically make a simplifying assumption that yields a worst case analysis. Typically, the crosstalk calculation tools assume that all signal nets switch at the same time; thereby combining the crosstalk contributions from all of the neighbor nets directly together to produce a crosstalk pulse on the victim net.

The timing of signal transitions on neighbor nets relative to each other is one of the more critical factors in predicting the magnitude of crosstalk noise. This is illustrated by the example in FIG. 1 where four neighboring signal networks SIG1, SIG2, SIG3, and SIG4 couple noise onto the victim signal network SIG0. Each net is connected to a respective driver (D0, D1, D2, D3, and D4) and receiver (R0, R1, R2, R3, and R4). If we assume each of the four neighbor nets generates 100 mV of crosstalk during switching, the worst case assumption yields a total of 400 mV as the magnitude of the crosstalk coupling onto SIG0. This essentially assumes that when a victim net is analyzed, all neighbors switch simultaneously as shown in the timing diagram of FIG. 2A. If signal transitions on the neighbor nets are not in phase, however, then merely adding the crosstalk noise of each net results in an incorrect assumption of the worst case. FIG. 2B shows a more realistic example of signal timing for the four signals. As shown, four independent 100 mV crosstalk pulses are generated at different times, resulting in a total crosstalk value of 100 mV. Therefore an error factor of 300% is made by overly pessimistic timing assumptions. Furthermore, depending on when the receiver on the victim net (R0) samples the signal on SIG0, for example when the clock signal CLK0 is activated, there might be zero crosstalk that affects the receiver (R0) circuitry.

Therefore, even a crosstalk analysis tool with perfect modeling of geometric coupling, without inter-signal timing information, will yield highly exaggerated crosstalk estimations and will falsely predict that many of the signal nets have failed their crosstalk noise threshold. In most high density designs this inaccuracy can quickly grow to an order of magnitude, causing unacceptable numbers of crosstalk false alarms. With the trend toward design of higher speed circuits in smaller packages, the conventional crosstalk analysis tools thus have become effectively obsolete.

One crosstalk analysis tool that has attempted to address this problem is Cadence Design Systems Inc.'s Allegro CBD. Allegro was modified to allow the user to manually input timing information properties. For example, Allegro allows the user to specify properties describing time periods during which individual nets are active (i.e. change states). Allegro will avoid summing crosstalk from two neighbor nets if the signals on those neighbor nets have non-overlapping active periods. This drastically reduces crosstalk pessimism. This approach, however, places a heavy burden on the designer and tends to be tedious and error prone. The user must manually consider, generate and input all the multiple timing modes of design operations and all of the detailed incremental delays beyond the clocking.

From the foregoing, it can be appreciated that there is a need for an improved crosstalk analysis tool capable of calculating crosstalk with real-world timing accuracy.

SUMMARY OF THE INVENTION

The present invention provides for a crosstalk analysis system with real-world accuracy based on combining forward-annotated, automatically extracted circuit timing information with circuit layout information.

The present invention takes advantage of existing circuit simulation tools to obtain the required timing information. According to a preferred embodiment, the user designates, through a computer interface means, reference signals as triggers to monitor the activity of other signals in a circuit design. The reference signal defines a time window within which all events are recorded. A circuit simulation tool is then utilized to analyze the functionality of the circuit, including timing of signal switchings, based on the circuit design information and a set of input stimuli. The special monitoring triggers allow for an expanded simulation that provides the required timing information for crosstalk analysis. An accumulator means accumulates the data from the monitored signal activity, and converts it into a summary of signal net timing behavior in a format suitable for use by typical pairwise crosstalk coupling analysis tools. The summary of net activities includes each signal net name with an associated active time period within the reference signal time window. The output of the accumulator means is then automatically forwarded to a crosstalk analysis tool which comprehends the active time periods for neighbor nets and avoids summing crosstalk when there is no overlap. The present invention also allows the user to set the time resolution of a particular activity event, and to manually adjust timing qualifiers to improve accuracy of calculations for a particular circuit.

A further understanding of the nature and advantages of the timing-driven crosstalk simulator of the present invention may be gained with reference to the description and diagrams below.

DESCRIPTION OF THE SPECIFIC EMBODIMENTS

Figure 1:
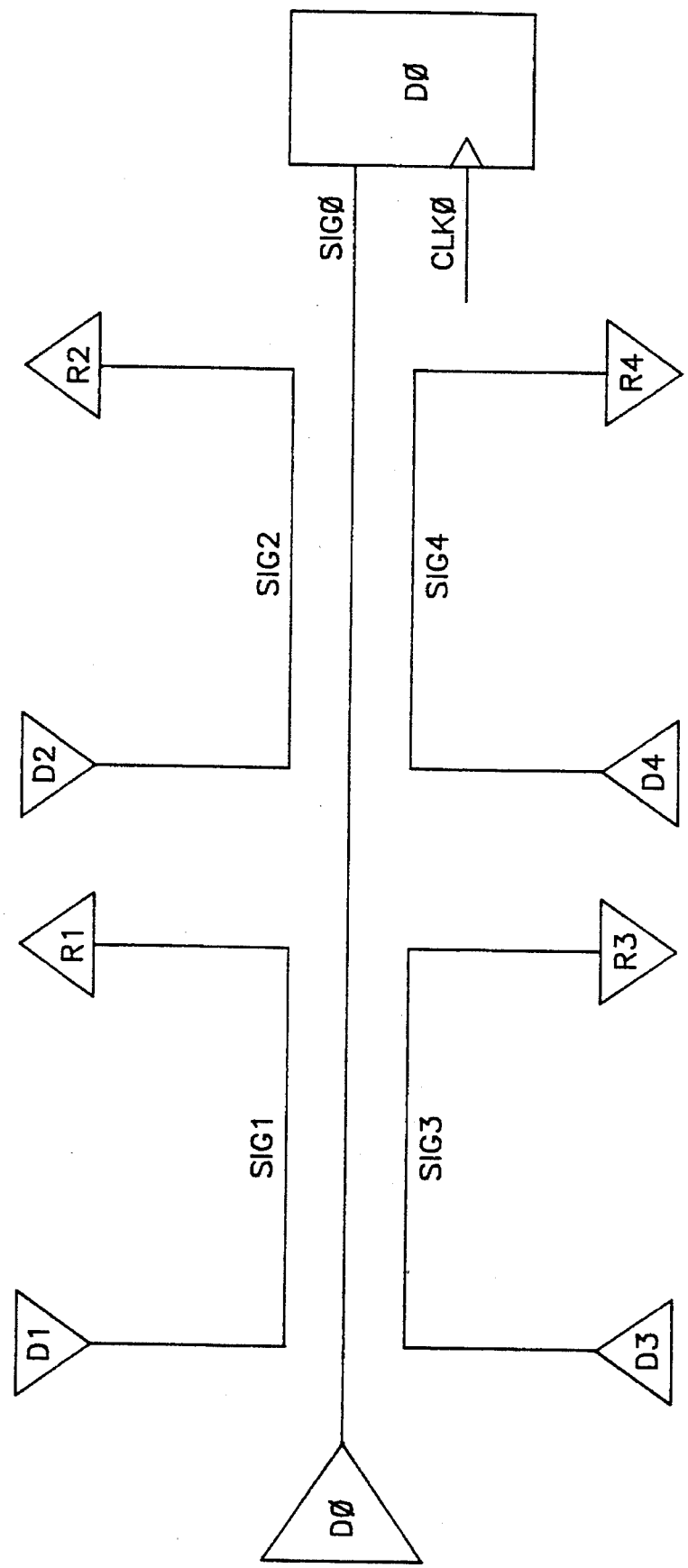
FIG. 1 is an example of a circuit layout showing neighboring signal nets to illustrate inter-signal crosstalk.
Figure 2:
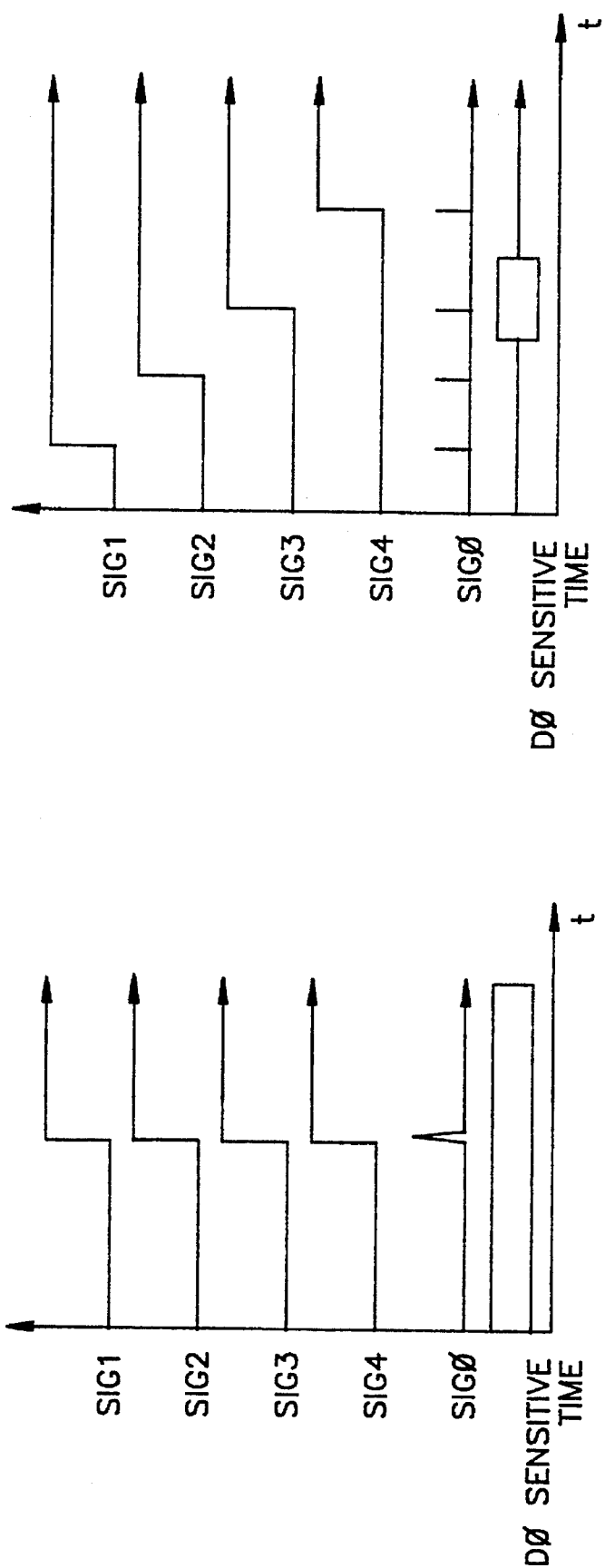
FIGS. 2A and 2B are timing diagrams illustrating crosstalk calculation based on worst case (simplified timing) assumption and real-world circuit timing, respectively.
Figure 3:
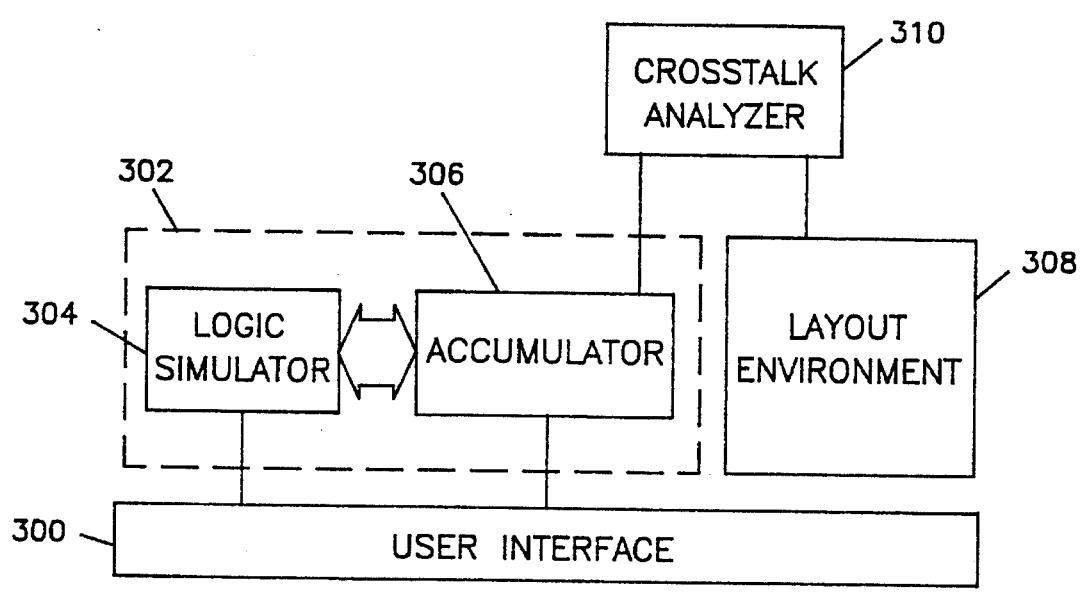
FIG. 3 is a block diagram of a system for timing-driven crosstalk analysis according to the present invention.

A simplified block diagram showing the timing-driven crosstalk analysis system of the present invention is shown in FIG. 3. Once the schematic design of a circuit is completed, through a user interface 300, such as a workstation including a monitor and a keyboard and/or a mouse, the designer enters the schematic, as well as a simulation control file, into a simulation environment 302. The simulation environment 302 includes a logic simulator 304 and an accumulator 306 that are interconnected. The user specifies in the simulation control file circuit stimuli and other simulation parameters, as well as crosstalk-specific reference signals. The reference signals are used as clocks to trigger the monitoring of the switching activity for a user-specified list of nets within a repeating clock window. This special monitoring expands the scope of standard logic simulation to extract crosstalk-specific timing information. The logic simulator 304 receives the schematic information and simulation control file and performs expanded functional simulation of the design. As the simulator 304 performs expanded simulation, accumulator 306 produces a summary of all monitored switching activity for the specified nets on a real-time basis. The summary of timing information is placed in a table that, for a given clock cycle, specifies time periods during which each selected net is active. This time window information then directly feeds into a crosstalk analyzer 310 that also receives circuit layout information from layout environment 308. Simulation and layout environments 302 and 308 may either be incorporated in the same, for example, UNIX-based computer workstation, or in separate workstations on the same network. Crosstalk analyzer 310 combines the circuit layout information and the timing information to calculate real-world inter-signal crosstalk estimates. Crosstalk analyzer 310 is capable of analyzing the layout in either batch mode or real-time mode. In batch mode, a completed circuit layout is analyzed for crosstalk, while in real-time mode crosstalk analyzer 310 interacts with the layout environment 308 as the circuit is being laid out.

Figure 4:
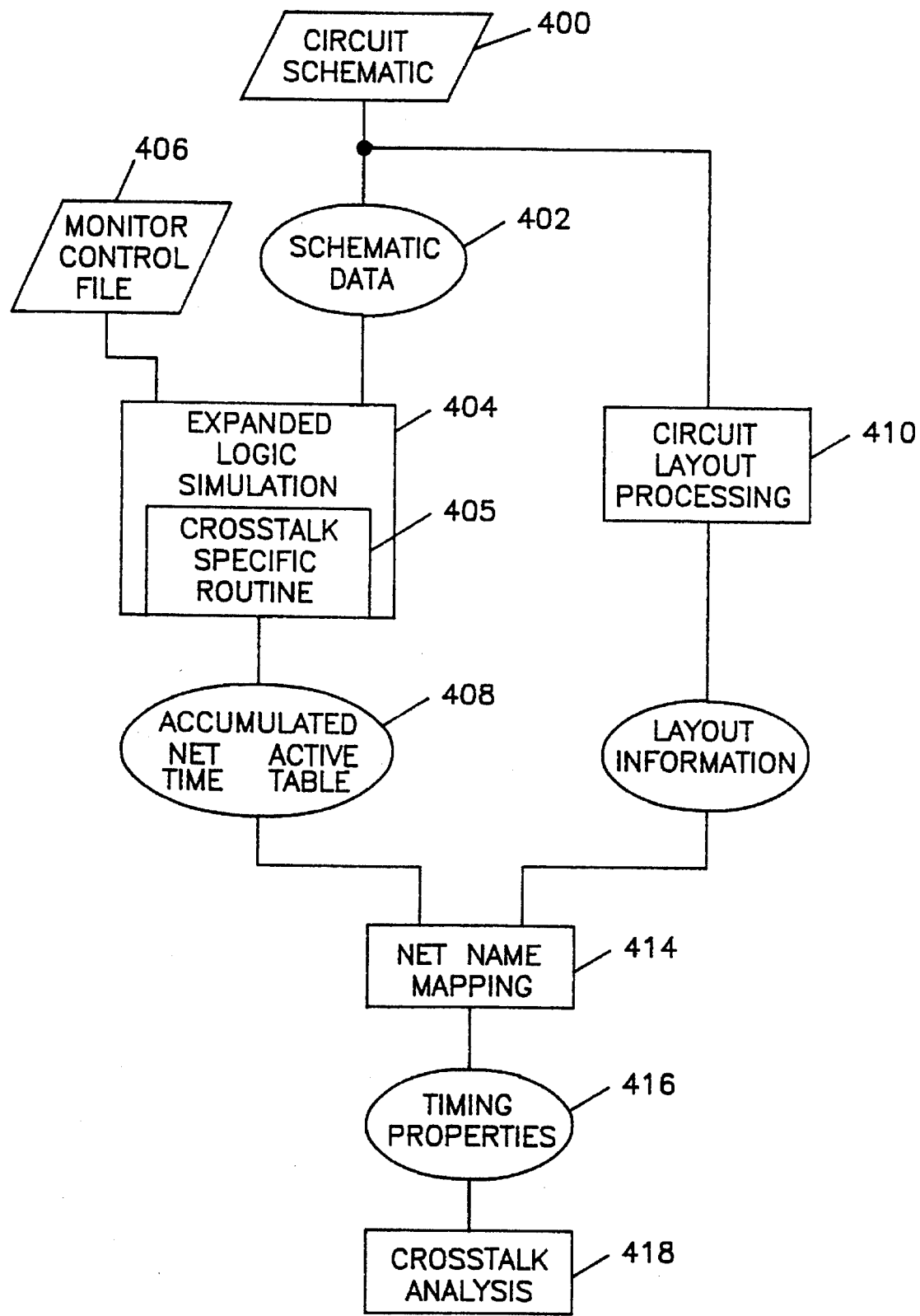
FIG. 4 is a flow diagram representing the overall process of forward-annotating timing information according to the present invention.

FIG. 4 illustrates in more detail the process flow for the timing-driven crosstalk analysis system of the present invention. The designer first generates a schematic 400 for the design and enters the schematic into the simulation environment using well known computer aided design (CAD) tools. Any one of a variety of existing CAD workstations that provide for schematic entry and automatic simulation can be used. Based on the schematic data 402, the workstation performs standard logic simulation 404. The scope of the logic simulation 404 is expanded by appending a monitoring control file 406 which defines the parameters for obtaining timing information for crosstalk analysis.

The principles of this invention apply to logic simulators with standard capabilities such as Verilog-XL (c), a product of Cadence Design Systems, Inc., which is used here for purposes of illustration. The monitor control file 406 is a standard text file generated by the user which defines how Verilog-XL monitors and compiles the timing information on specified signal nets within the circuit. This file includes a list of signal nets to be monitored from the schematic that are in the form of, for example:

beginlist:

net-a net-b

. . .

endlist

If no list is specified, Verilog-XL will monitor all signal nets. Next, a reference cycle time in the form of, for example, windowlength: 100 is specified in the file to trigger the monitoring cycle. To synchronize the time zero point within the monitored window to circuit clocking, the user specifies the rising (clockhi) or falling (clocklow) edges of the clock signal that provides the reference cycle. All relative times of logic transitions for the list of signal nets are thus monitored every time the cycle is repeated. To account for the inaccuracies or uncertainties in timing models used by the logic simulator, the user can also modify the resolution of the activity event. For example, if the circuit technology in use switches state with a rise- or fall-time of 10 ns, but the logic simulation is known to approximate switching as instantaneous, the user can add a margin of +/–5 ns to time window event monitoring. This enables the user to further fine tune the accuracy of the crosstalk analysis by qualifying the timing information according to specific circuit characteristics, such as driver behavior. Resolution in the monitor control file 406 can be specified by a statement such as "timeunits:5" while adjustments can be specified by statements such as "timeplus:5" or "timeminus:1." All time values in the monitor control file 406 are integers with units equal to the finest resolution of the simulation run setup. Start time and number of windows can be specified in a similar fashion to only monitor a desired subset of the simulation.

Using the schematic data 402 and the monitor control file 406, Verilog-XL performs expanded logic simulation 404 for the circuit. The expanded logic simulation incorporates a crosstalk-specific routine 405 that is guided by the control file 406 to monitor and accumulate signal activity time periods within the predefined reference time window. The crosstalk-specific routine 405 is implemented using a customized Verilog-XL executable file. The routine 405 traps reference signal transition events to reset a window viewpoint, and traps non-reference signal transitions to be combined with resolution information to build a structure of activity time periods related to the preceding reference signal edge. The routine arranges the results of the accumulated signal activity times in a time table 408 specifying for each signal net its respective active time windows. The following is an example of the syntax for output 408 of the expanded simulation 404:

| Signal Net | Active Time Period |
|---|---|
| RW | 1–35 |
| DBEN | 1–75   81–115 |
| AS | 41–75 |
| DS | 41–90 |

This information and the format in which it is presented can be directly used by a crosstalk analyzer such as Allegro CBD.

The circuit layout information 412 is generated from the circuit schematic design 400 through a layout processor 410. Many of today's CAD workstations incorporate the circuit simulation and layout environments in the same machine, and automatically generate the circuit layout from the circuit schematic. However, depending on the type of technology (e.g. analog circuitry), predefined layout cells may not be applicable and at least parts of the circuit layout are manually customized. In either case, the signal naming conventions in the two environments (schematic for Verilog-XL and layout for Allegro) are often quite distinct. That is, the naming convention used by Verilog-XL for referring to the circuit signal nets for simulation purposes is different than that used by Allegro. Therefore, before the active time window information and the circuit layout information can be combined to perform Allegro style crosstalk analysis, proper name mapping 414 must occur to match the two sets of information. The net name mapping 414 process includes creating name mapping data files that are used to convert net names and to generate a final set of timing properties 416 with appropriate net names for Allegro crosstalk analysis 418. Allegro then avoids summing crosstalk between neighbor nets whose active time periods do not overlap. Using the above example of signal net active time periods, any net laid out in parallel to both net RW (active time: 1–35) and AS (active time: 41–75) will be considered to accumulate only the greater of their crosstalk ingredients, not their sum. A signal net laid in parallel to nets AS (active time: 41–75) and DS (active time: 41–90) will accumulate the sum of any crosstalk contribution by either of the two nets during the overlapping active time period.

In addition to the active time periods stored as net properties, Allegro accepts two other properties to further improve accuracy. These two properties are net sensitive times and crosstalk ignore-nets. As discussed earlier not every crosstalk coupling adversely affects the operation of the circuit. If the signal on a victim net is not sampled until after the crosstalk coupling dissipates, the effects of that crosstalk can be totally ignored. A common example is a clocked data bus. Data levels are placed on the bus during a WRITE operation at a given time, subsequent to which a READ operation occurs. The bus typically will be routed as a tight group of conductors resulting in high crosstalk coupling between adjacent bits. Data is typically written onto the bus at the same time, and thus the crosstalk coupling between the bus lines will occur roughly within a small bus length delay after this active WRITE operation. If the READ operation only occurs well after the crosstalk events associated with the WRITE operation dissipate, all crosstalk between individual bus lines can be safely ignored. Allegro provides the option of designating nets whose crosstalks can be ignored (net-ignore), as well as time periods during which crosstalk can be ignored for a particular net (net sensitive times). Therefore, Allegro will allow the above synchronous data bus, or other similar special cases, to be routed with the minimum layout spacing, instead of trying to space the conductors apart to reduce crosstalk. This feature further eliminates the unnecessary constraints on the layout design.

Figure 5:
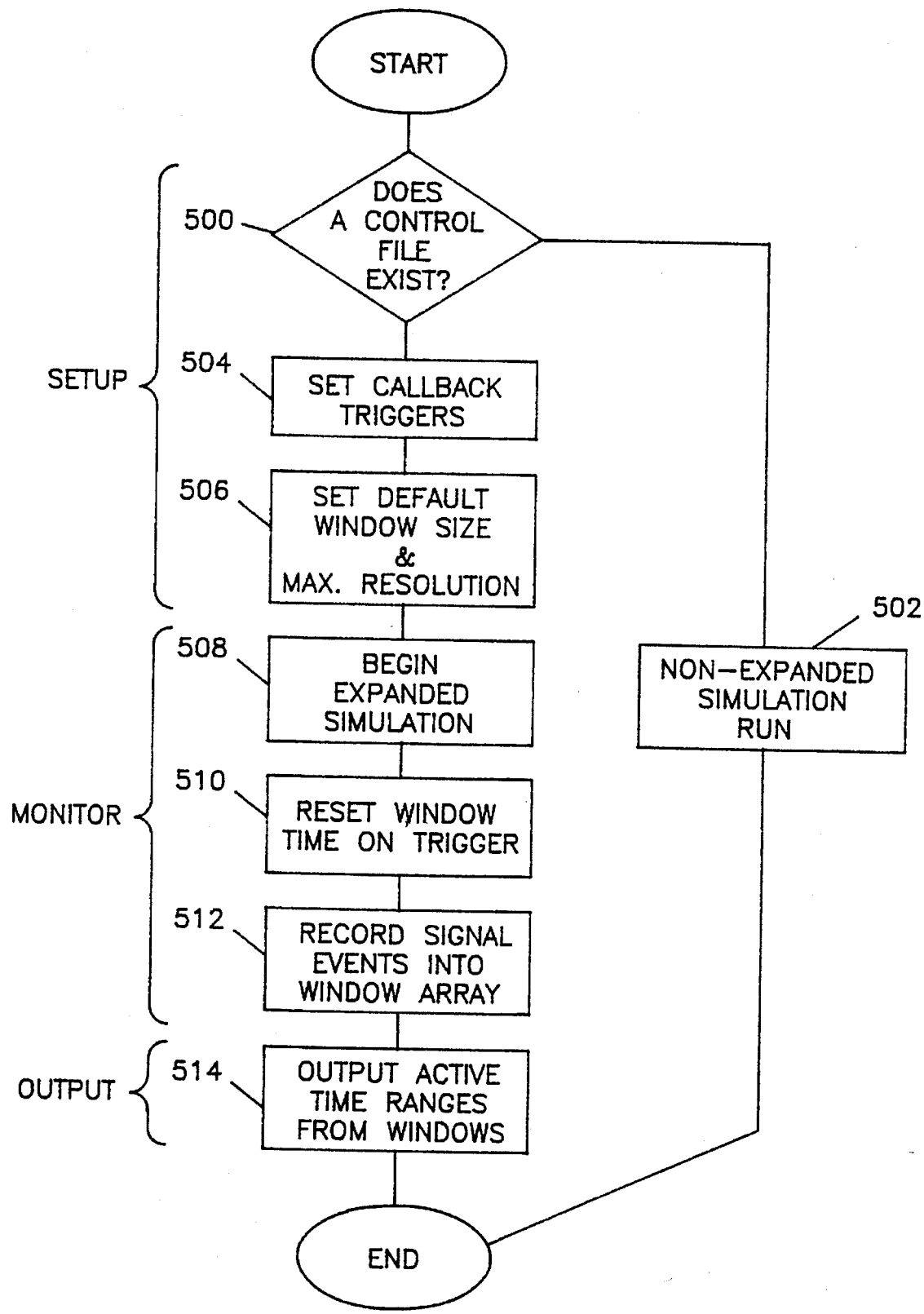
FIG. 5 is a flow diagram illustrating the process of generating active time windows for use in crosstalk analysis based on functional simulation.

FIG. 5 is a flow chart showing the simulation monitor flow and the operation of the crosstalk-specific routine 405 in more detail. The operation is divided into three stages: setup, monitor and output. The routine first checks for a monitor control file (step 500). If one does not exist, the logic simulator performs a standard, non-expanded logic simulation of the circuit (step 502). If a monitor control file exists, the routine proceeds to set callback triggers (or traps) in the simulation per reference signals (clocks) and other specified signal nets (step 504). Next, default is set for window size and maximum resolution (step 506) for those time periods within the simulation run when no clock signal edge occurs. This completes the setup. The monitor phase begins at the start of the expanded logic simulation (step 508). While the standard logic simulation is in progress, windows are reset every time a preset trigger is encountered (step 510), and detected signal events (e.g. signal transitions) are recorded into the window array (step 512). The recording of the signal events will incorporate timeplus or timeminus resolution adjustments if the control file specifies this information. At the end of the simulation run, all monitored timing information accumulated in window arrays are output as active time ranges per signal net (step 514).

The foregoing is a complete description of a specific embodiment of the present invention which offers a crosstalk analysis system that is capable of generating real-world estimates of crosstalk noise based on forward-annotated inter-signal timing information. The above description does not preclude the use of various alternatives, modifications and equivalents. Therefore, the scope of the present invention should be determined not with reference to the above description but should, instead, be determined with reference to the appended claims, along with their full scope of equivalents.

What is claimed is:

1. A computer aided design (CAD) system capable of performing improved crosstalk analysis on a plurality of signal nets in a circuit, said CAD system comprising:

a user interface for entering (i) a circuit schematic information file representing circuit elements and interconnections therebetween, and (ii) a simulation control file comprising user-defined circuit function stimuli and crosstalk-specific commands;

a circuit simulation module coupled to said user interface, said circuit simulation module for simulating functionality of the circuit based on said schematic information file and said simulation control file, and for generating a circuit timing information file;

an accumulator coupled to said circuit simulation module, said accumulator for accumulating timing information on signal switching activity for said plurality of signal nets, and generating a crosstalk-specific summary signal active time table; and a crosstalk analyzer, coupled to said accumulator, for generating inter-signal crosstalk estimates in response to a circuit layout information file and said crosstalk-specific summary signal active time table.

2. The CAD system of claim 1 wherein said crosstalk analyzer ignores crosstalk when said crosstalk-specific summary signal active time table indicates nonoverlapping crosstalk periods.

3. The CAD system of claim 1 wherein said accumulator interacts with said circuit simulation module to accumulate timing information in real time.

4. The CAD system of claim 1 further comprising a circuit layout module for generating said circuit layout information file based on said circuit schematic information file.

5. In a computer aided design (CAD) system, a method for accurately estimating crosstalk between neighboring signal nets in a circuit, comprising machine executed steps of:

(a) entering a circuit schematic information file into the CAD system;

(b) entering a simulation monitor control file;

(c) performing expanded simulation of the circuit based on said circuit schematic information file and said simulation monitor control file, to automatically extract a signal net timing activity file;

(d) accumulating a crosstalk-specific net timing activity data file in response to said simulation monitor control file, and in a format suitable for use by crosstalk analysis tools;

(e) automatically forward-annotating said net timing activity data file into a crosstalk analysis tool; and (f) performing crosstalk analysis based on a circuit layout information file and said summary net timing activity file to obtain accurate crosstalk estimates.

6. The method of claim 5 wherein said step of performing crosstalk analysis comprises ignoring crosstalk ingredients when said net timing activity data file indicates nonoverlapping crosstalk periods.

7. The method of claim 6 further comprising machine executed steps of:

(g) automatically generating said circuit layout information file based on said circuit schematic information file; and (h) mapping a plurality of net names used in said schematic information file into said circuit layout information file before said step of performing crosstalk analysis.

8. The method of claim 7 wherein said simulation monitor control file comprises:

a plurality of designated timing reference signals, a list of a plurality of signal nets to be monitored, size of a plurality of time window arrays, and a timing resolution for said signal net timing activity file.

9. The method of claim 8 wherein said accumulating step comprises a machine executed step of monitoring signal activity, said step of monitoring further comprising machine executed steps of:

(i) trapping transition events of said plurality of designated timing reference signals to reset viewpoint of said plurality of time window arrays;

(j) trapping a plurality of transition events for said list of a plurality of signal nets;

(k) combining said timing resolution while logging said plurality of transition events for said list of said plurality of signal nets; and (l) recording a plurality of logged signal transition events into said plurality of time window arrays.

10. The method of claim 9 wherein said monitor control file further comprises a list of crosstalk ignore nets and net sensitive times.

11. The method of claim 10 further comprising machine executed steps of:

(m) ignoring crosstalk coupling onto nets specified in said list of crosstalk ignore nets; and (n) ignoring crosstalk coupling occurring during times outside said net sensitive times.

* * * * *